United States Patent [19]
Park

[11] Patent Number: 5,862,074
[45] Date of Patent: Jan. 19, 1999

[54] INTEGRATED CIRCUIT MEMORY DEVICES HAVING RECONFIGURABLE NONVOLATILE MULTI-BIT MEMORY CELLS THEREIN AND METHODS OF OPERATING SAME

[75] Inventor: Jong-Wook Park, Seoul, Rep. of Korea

[73] Assignee: Samsung Electronics Co., Ltd., Suwon, Rep. of Korea

[21] Appl. No.: 944,876

[22] Filed: Oct. 6, 1997

Related U.S. Application Data

[63] Continuation-in-part of Ser. No. 763,612, Dec. 11, 1996, Pat. No. 5,768,188.

[51] Int. Cl.$^6$ .................................................. G11C 16/04
[52] U.S. Cl. ............................. 365/185.03; 365/185.21; 365/185.33
[58] Field of Search .................... 365/185.17, 185.21, 365/185.23, 185.24, 185.33, 185.03, 189.05

[56] References Cited

U.S. PATENT DOCUMENTS

| | | | |
|---|---|---|---|
| 5,550,772 | 8/1996 | Gill | 365/185.03 |
| 5,554,552 | 9/1996 | Chi | 437/43 |
| 5,563,828 | 10/1996 | Hasbun et al. | 365/185.33 |
| 5,566,125 | 10/1996 | Fazio et al. | 365/45 |
| 5,570,315 | 10/1996 | Tanaka et al. | 365/185.22 |
| 5,625,584 | 4/1997 | Uchino et al. | 365/45 |
| 5,748,529 | 5/1998 | Lee | 365/185.17 |
| 5,748,536 | 5/1998 | Kwon et al. | 365/185.17 |
| 5,768,188 | 6/1998 | Park et al. | 365/185.17 |

OTHER PUBLICATIONS

M. Bauer et al., *A Multilevel–Cell 32Mb Flash Memory*, ISSC Digest of Technical Papers, p. 132–133, Feb. (1995).

*Primary Examiner*—David Nelms
*Assistant Examiner*—Trong Phan
*Attorney, Agent, or Firm*—Myers Bigel Sibley & Sajovec

[57] ABSTRACT

Integrated circuit memory devices contain a plurality of nonvolatile memory cells and preferred circuits for selectively configuring the memory cells as multi-bit memory cells having more than two programmable states, during a multi-bit mode of operation, or for configuring the memory cells as single-bit memory cells during a single-bit mode of operation. The preferred circuits contain first and second sense amplifiers that can be electrically coupled to first and second strings of memory cells in the plurality thereof, and a pass transistor for electrically connecting sense nodes of the first and second sense amplifiers together during the multi-bit mode of operation. The first and second sense amplifiers also contain first and second latches, respectively, and the first and second latches each have normal and complementary outputs. The normal outputs of the first and second latches are electrically coupled to first and second input/output lines, respectively. First and second latch control circuits are also provided for enabling the single-bit and multi-bit modes of operation. Here, the single-bit mode of operation (i.e., two-state mode of operation) may be used for high fidelity applications requiring fault-free operation and the multi-bit mode of operation (e.g. four-state mode of operation) may be used for applications involving the storage of mass amounts of information such as audio data, where memory loss or corruption of small amounts of data does not significantly affect the fidelity of the information when read as a whole.

33 Claims, 9 Drawing Sheets

INTEGRATED CIRCUIT MEMORY DEVICES HAVING RECONFIGURABLE NONVOLATILE MULTI-BIT MEMORY CELLS THEREIN AND METHODS OF OPERATING SAME

This application is a continuation-in-part (CIP) of application Ser. No. 08/763,612, filed Dec. 11, 1996, now U.S. Pat. No. 5,768,188.

FIELD OF THE INVENTION

The present invention relates to integrated circuit devices and more particularly to nonvolatile integrated circuit memory devices and methods of operating same.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V^{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Reading of the EEPROM device is achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

Erasing of the EEPROM device may also be achieved by removing the stored charge from the floating gate. The erasure process can be achieved, for example, by grounding the control gate and applying a positive bias to the substrate (e.g., 10–20 Volts). Accordingly, flash EEPROM devices typically require bulk erasure of large portions of an array of cells since the effects of applying a large substrate bias typically cannot be confined to a single EEPROM cell.

Although the above-described memory cells have been described as two-state devices having only one erased and one programmed state, accurate control of the threshold voltages of an EEPROM cell can be utilized to provide a multi-bit memory device having more than two states. For example, rather than just an erased state where $Vth \leq -3V$ and a programmed state where $Vth \geq 1V$, an EEPROM memory cell may be carefully programmed to have four (4) states, for example, where a $Vth \leq -2V$ represents state "11", $Vth=-1$ represents state "10", $Vth=0V$ represents state "01" and $Vth=1V$ represents state "00". Thus, an EEPROM memory cell can be programmed as a two-bit device instead of just a one-bit device to advantageously double the amount of information an EEPROM memory cell may contain. Exemplary integrated circuit memory devices containing multi-bit cells therein are described in U.S. Pat. No. 5,566,125 to Fazio et al. entitled *Method and Circuitry for Storing Discrete Amounts of Charge in a Single Memory Element* and U.S. Pat. No. 5,550,772 to Gill entitled *Memory Array Utilizing Multi-State Memory Cells*.

An integrated circuit memory device containing multi-bit cells therein is also described in an article by M. Bauer et al. entitled *A Multilevel-Cell 32 Mb Flash Memory*, ISSC Digest of Technical Papers, pp. 132–133, February (1995). In the Bauer et al. article, a memory cell array is arranged in a NOR-type arrangement. Each memory cell is capable of storing one of four states with two bits such as "00", "01", "10" and "11". Each of the four states corresponds to a unique voltage level, e.g., "00"=2.5V, "01"=1.5V, "10"= 0.5V and "11"=−3V. The voltage levels are stored as threshold voltages of the cells.

To detect a state of a multi-bit memory cell, a read voltage having a level interposed between a threshold voltage level (or positioned on a lower side or a higher side from the level of a threshold voltage) must be applied to gates of the memory cells through a word line coupled thereto. Here, the width between adjacent threshold voltages (hereinafter referred to as the threshold voltage "window") is less than in a normal flash memory. For example, the window in a four-state flash memory is about 0.6V. Furthermore, when a word line voltage for reading is located in the window of about 0.6V, the margin from an edge of the threshold voltage profile and the level of the word line voltage may be not more than about 0.3V. Therefore, if a multi-bit flash memory is made with accompanying variations in the manufacturing process or influenced by variations in word line voltage level and temperature, the possibility of experiencing an invalid sensing operation (i.e., read operation) is increased. Such weak immunity against variations in external conditions typically limits the utility of these multi-bit devices to the storage of mass information such as audio data, where memory loss or corruption of small amounts of data does not significantly affect the fidelity of the information when read as a whole. Moreover, even though the advantages of the normal single-bit and newer multi-bit flash memories are well known, the two types of flash memories are typically fabricated on separate semiconductor chips.

Thus, notwithstanding the above described techniques for improving the capacity of an integrated circuit memory device by employing multi-bit memory devices therein, there continues to be a need for improved memory devices which can advantageously use multi-bit devices therein.

SUMMARY OF THE INVENTION

It is therefore an object of the present invention to provide improved integrated circuit memory devices and methods of operating same.

It is another object of the present invention to provide integrated circuit memory devices having multi-bit cells therein and methods of operating same.

It is still another object of the present invention to provide integrated circuit memory devices for applications requiring fault-free operation and applications requiring expanded memory capability and methods of operating same.

These and other objects, advantages and features of the present invention are provided by integrated circuit memory devices that contain a plurality of nonvolatile memory cells and preferred circuits for selectively configuring the memory cells as multi-bit memory cells having more than two programmable states, during a multi-bit mode of operation, or for configuring the memory cells as single-bit memory cells during a single-bit mode of operation. According to one embodiment of the present invention, the preferred circuits contain first and second sense amplifiers that can be electrically coupled to first and second strings of memory cells in the plurality thereof, and a pass transistor for electrically connecting sense nodes of the first and second sense amplifiers together during the multi-bit mode of operation The first and second sense amplifiers also contain first and second latches, respectively, and the first and second latches each have normal and complementary outputs. According to a preferred aspect of the present invention, the normal outputs of the first and second latches are electrically coupled to first and second input/output lines, respectively. First and second latch control circuits are also provided for enabling the single-bit and multi-bit modes of operation. Here, the single-bit mode of operation (i.e., two-state mode of operation) may be used for high fidelity applications requiring fault-free operation and the multi-bit mode of operation (e.g. four-state mode of operation) may be used for applications involving the storage of mass amounts of information such as audio data, where memory loss or corruption of small amounts of data does not significantly affect the fidelity of the information when read as a whole.

The present invention also includes preferred methods of reading and programming the preferred memory device. In particular, according to another embodiment of the present invention, an integrated circuit memory device is provided that contains an array of memory cells, first and second input/output lines electrically coupled to respective first and second sense amplifiers, and first and second bit lines electrically coupled to respective first and second pluralities of memory cells in the array. In this memory device, a preferred method of reading data includes the steps of electrically coupling the second bit line to a selected memory cell in the second plurality of memory cells and to first and second sense nodes in the first and second sense amplifiers. A first word line potential is then applied to the selected memory cell and then the first and second input/output lines are driven with first data if a state of the selected memory cell is a first state. A second word line potential is also applied to the selected memory cell and then the first and second input/output lines are driven with second data if the state of the selected memory cell is a second state unequal to the first state. In addition, a third word line potential is applied to the selected memory cell and then the first and second input/output lines are driven with third data if the state of the selected memory cell is a third state unequal to the first or second states. Preferably, the electrically coupling step comprises electrically connecting the first and second sense nodes together using a pass transistor and is preceded by the steps of electrically connecting the first and second bit lines to the first and second sense nodes, respectively, electrically connecting the first and second sense nodes together and driving the first and second sense nodes to a first reference potential to reset the first and second sense amplifiers. This preferred embodiment also preferably includes the steps of electrically disconnecting the first bit line from the first sense node during the steps of applying first, second and third word line potentials. Accordingly, the present invention provides a memory device having cells therein that can be selectively programmed as single-bit cells for certain applications requiring high fidelity and as multi-bit cells for certain other applications that may require less fidelity.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
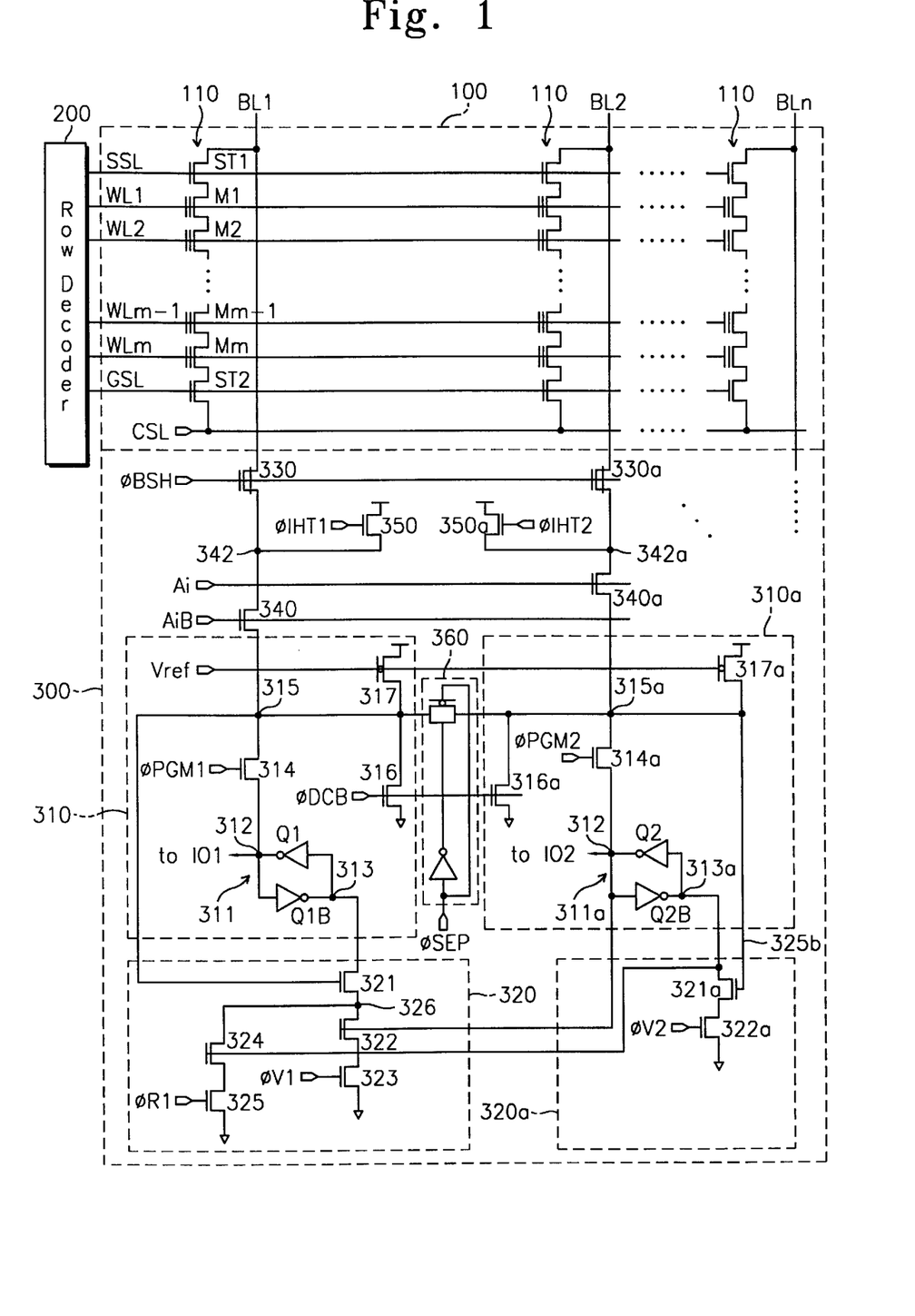
FIG. 1 is a cross-sectional view of a nonvolatile memory device according to a first embodiment of the present invention.

Referring to FIG. 1, memory cell array 100 is formed with a plurality of strings 110 having a NAND-typed arrangement and each of the strings is organized with string selection transistors ST1 and ST2 and memory cells M1 to Mm and is coupled to each of bit lines BL1 to BLn. In string 110, memory cells M1 to Mm are serially connected between string selection transistor ST1 coupled to bit line BL1 (or any one of BL1 to BLn) and string selection transistor ST2 coupled to common source line CSL. Gates of string selection transistors ST1 and ST2 are coupled to string and ground selection lines SSL and GSL, respectively. Gates of memory cells M1 through Mm are coupled to word lines WL1 through WLm, respectively. The string selection lines and word lines are connected to outputs of row decoder 200. The memory cell array 100 is interconnected with page buffer circuitry 300.

In the page buffer circuitry 300, adjacent bit lines BL1 and BL2 are coupled to their corresponding latched sense amplifiers (or page buffers) 310 and 310a, respectively. Each latched sense amplifier performs the functions of amplifying and latching data. In latched sense amplifier 310 (the same with latched sense amplifier 310a), bit line BL1 is connected to latch 311 through the drain-to-source paths of depletion transistor 330 and NMOS transistors 340 and 314. The gate of depletion transistor 330 is coupled to bit line shielding signal bBSH. Gates of transistors 340 and 314 are coupled to complementary address signal AiB and program signal (φGM1, respectively. Between power source voltage and sense node 342 (interposed between transistors 330 and 340) NMOS transistor 350 with gate coupled to inhibition signal φIHT1 is connected. Between power source voltage and node 315 (interposed between transistors 340 and 314) PMOS transistor 317 with gate coupled to reference voltage Vref is connected. NMOS transistor 316 whose gate is coupled to bit line discharge signal φDCB is connected between sense node 315 and ground. Latch 311 formed of two inverters is connected between nodes 312 (Q1) and 313 (Q1B). Node 312 is coupled to input/output line 101 which corresponds to the bit line BL1. Node 313 is coupled to ground through NMOS transistors 321, 322 and 323 in latch control circuit 320.

In latch control circuit 320, the gate of transistor 321 is coupled to sense node 315, the gate of transistor 322 is coupled to latch 311a which is involved in bit line BL2 adjacent to BL1, and the gate of transistor 323 is coupled to latch control signal φV1. Between node 326 (interposed between transistors 321 and 322) and ground, NMOS transistors 324 and 325 are connected in series. The gate of transistor 324 is coupled to node 313a (Q2B) of latch 311a. The gate of transistor 325 is coupled to latch control signal φR1.

In latched sense amplifier 310a, bit line BL2 is connected to latch 311a through the drain-to-source paths of depletion transistor 330a and NMOS transistors 340a and 314a. The gate of depletion transistor 330a is coupled to bit line shielding signal φBSH together with the gate of transistor 330. The gates of transistors 340a and 314a are coupled to address signal Ai and program signal φPGM2, respectively. Between the power source voltage and node 342a (interposed between transistors 330a and 340a) NMOS transistor 350a with gate coupled to inhibition signal φIHT2 is connected. Between the power source voltage and sense node 315a (interposed between transistors 340a and 314a) PMOS transistor 317a with gate coupled to reference voltage Vref, is connected. NMOS transistor 316a whose gate is coupled to bit line discharge signal φDCB is connected between sense node 315a and ground. Latch 311a formed of two inverters is connected between nodes 312a (Q2) and 313a (Q2B). Node 312a is coupled to input/output line 102 which corresponds to the bit line BL2. Node 313a is coupled to ground through NMOS transistors 321a and 322a in latch control circuit 320a, and is also coupled to the gate of transistor 324 in the latch control circuit 320. In latch control circuit 320a, the gate of transistor 321a is coupled to sense node 315a and the gate of transistor 322a is coupled to latch control signal φV2. Transmission gate 360 is also interposed to connect sense node 315 with sense node 315a, in response to separation signal φSEP which is activated when a multi-bit mode is enabled.

In FIG. 1, transistor 350 (or 350a) supplies a program inhibit voltage to bit line BL1 (or BL2) when it is not selected, in response to inhibit signal φIHT1 of a high level, so that an unselected bit line (e.g., BL1) is prohibited from an undesirable programming operation while a selected bit line (e.g., BL2) is programmed. Transistors 340 and 340a connect bit lines BL1 and BL2 to sense nodes 315 and 315a, respectively, in response to address signals AiB and Ai, respectively. Program signals φPGM1 and φPGM2 are simultaneously set high when discharge signal φDCB is activated to initiate latches 311 and 313a, and also selectively set high to transfer data from the latches to the sense nodes and the bit lines during a program operation. The φDCB initiates the latches by discharging sense nodes 315 and 315a prior to a read operation. The bit lines are put into floating states when an erasure operation is being conducted, but are initialized to ground level upon commencement of a read operation. In order to access two bits of data (that can be desired from four distinct threshold voltage levels), two input/output lines (e.g., IO1 and IO2) are used either when BL1 or BL2 is selected.

Figure 2A:
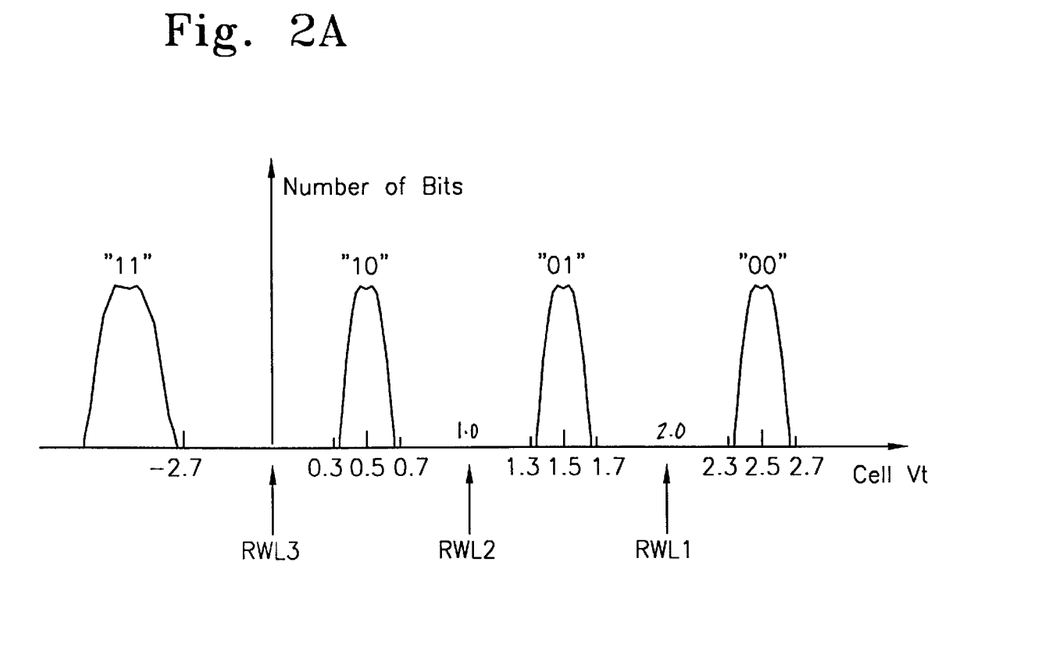
FIG. 2A is a graphical illustration of a relationship between states of a multi-bit memory cell at respective threshold voltages and word line voltages used to read the state of the memory cell.
Figure 2B:
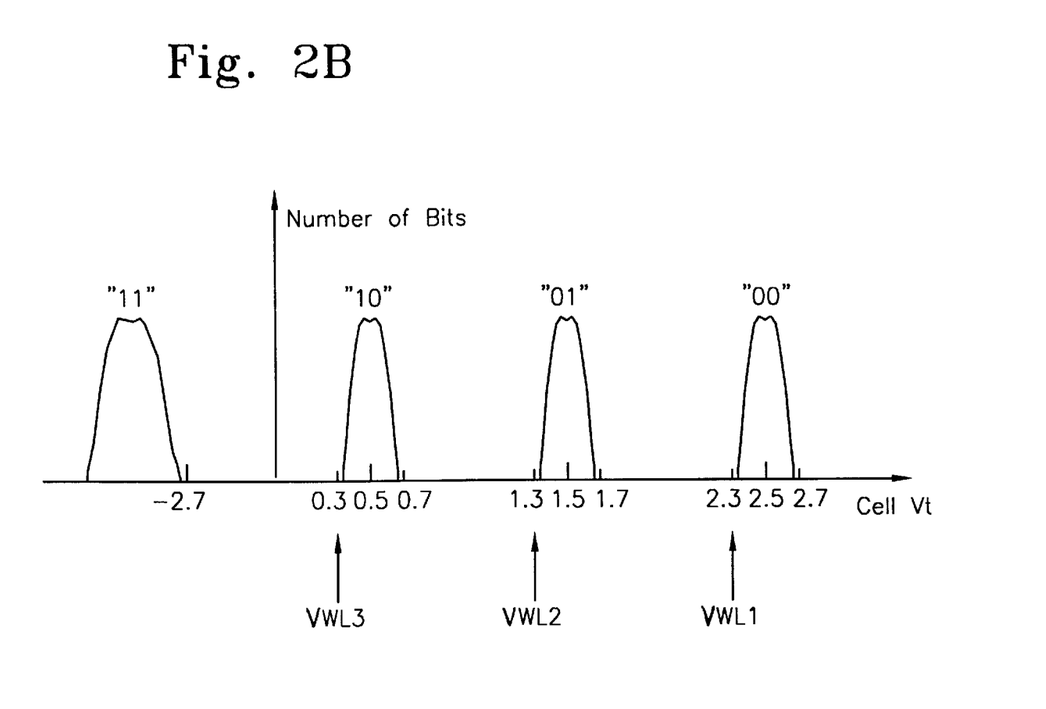
FIG. 2B is a graphical illustration of a relationship between states of a multi-bit memory cell at respective threshold voltages and word line voltages used to verify the state of the memory cell.

In FIG. 2A, in the case of a two-bit data read operation, four levels "00" to "11" of threshold voltages are possible and three levels of word line voltages can be used (RWL1 to RWL3) for reading the levels. Assuming that the states "00", "01", "10" and "11" are associated within the ranges from about 2.3V to 2.7V, from 1.3V to 1.7V, from 0.3V to 0.7V and below −2.7V, respectively, the word line voltages RWL1 to RWL3 may be established as 2V, 1V and 0V, respectively, as intermediate values for the voltages involved in the threshold profiles. When RWL1 is activated, only a memory cell storing "00" is situated in an off-state. On the other hand, a word line voltage of RWL3 determines that memory cells storing "00", "01" and "10" go to the off-states while the memory cell storing "11" is detected as being in an on-state which means it has been erased. For program verification, referring to FIG. 2B, word line voltages VWL1 through VWL3 are positioned at the lower ends of the threshold voltage profiles, respectively. Namely, VWL1 is the voltage a little lower than 2.3V, VWL2 is the voltage a little lower than 1.3V and VWL3 is the voltage a little lower than 0.3V, as shown in FIG. 2B. Hereinbelow, the operations of the circuit of FIG. 1 (such as multi-bit read, multi-bit programming, multi-bit programming verification, multi-bit erasure and multi-bit erasure verification) will be described. The memory according to an embodiment of the invention may be operable with a 3.3V power supply.

Performing Multi-bit Read Operations

Figure 3:
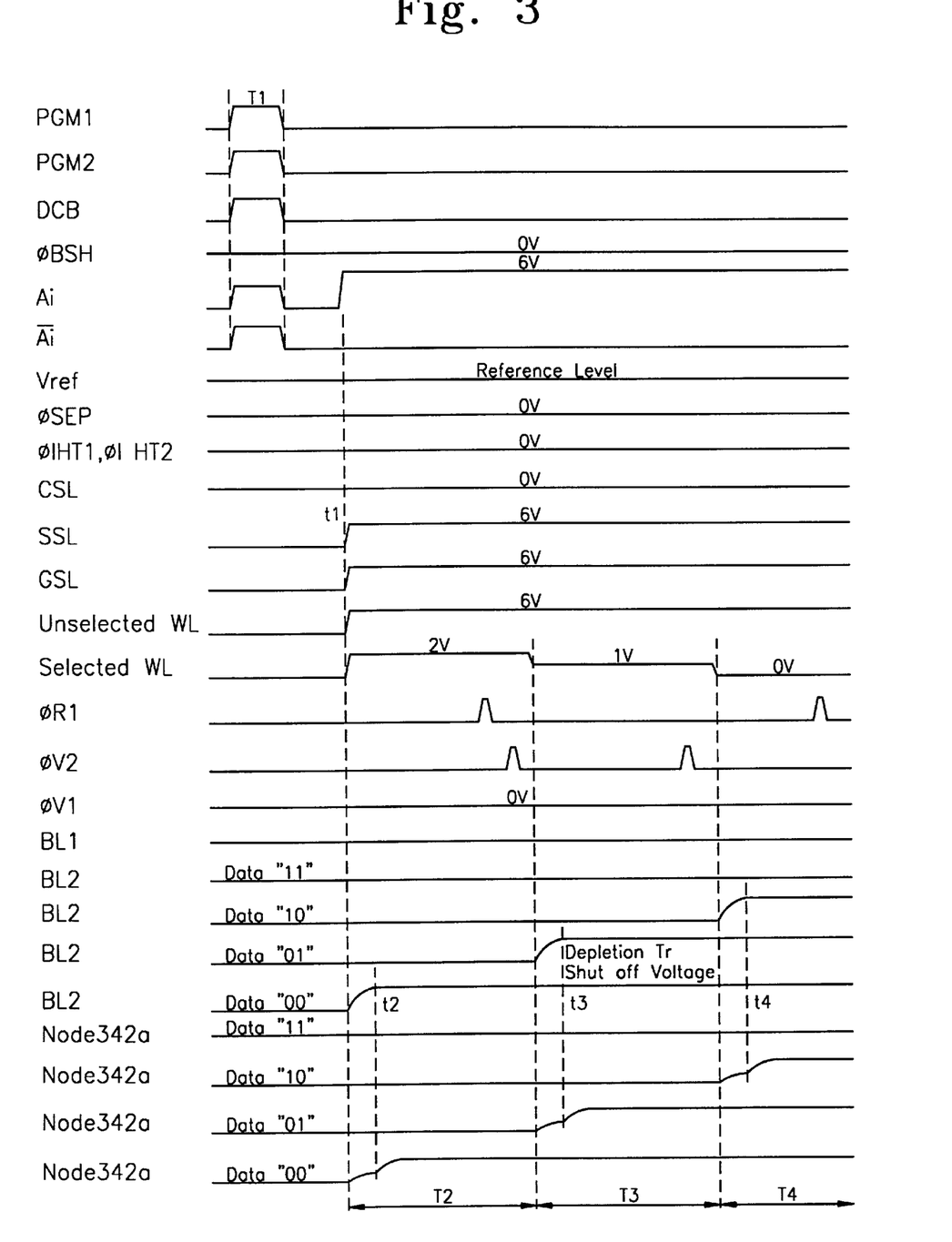
FIG. 3 is a diagram that illustrates the timing of signals used to perform multi-bit reading operations according to an embodiment of the present invention.

The operations for performing multi-bit read operations will now be described. Referring to FIG. 3, the circuit of FIG. 1 is initiated when nodes 312 and 312a (i.e., Q1 and Q2) are precharged to ground and latches 311 and 311a are set in reset states during time interval T1 when φPGM1, φPGM2 and φDCB are set to high levels and φSEP is held at a low level to connect sense node 315 to sense node 315a and pull both sense nodes to ground. Address signals Ai and AiB ($\overline{Ai}$) are also set high during time interval T1. This reset operation is performed at the beginning of every read cycle. Then, at time T2, address signal Ai is pulled up to a pumping level (about 6V in 3.3V power supply) to select a bit line (e.g., BL2) and a corresponding column of memory cells. It is well known that the pumping level can be achieved by means of a charge pump embedded in the memory. AiB, φIHT1 and φIHT2 are also held at a low levels to maintain the unselected bit line BL1 at ground level. The unselected bit lines also act as shielding lines for preventing the selected bit lines from being disturbed by interactive capacitive coupling between adjacent selected bit lines. In order to supply a sensing current to the selected bit line BL2, a non-zero Vref signal is generated by a reference voltage generator (not shown) and is applied to the gates of pull-up transistors 317 and 317a to maintain these pull-up transistors in a slightly conductive state so that the sense nodes can be driven to the power supply level unless a stronger pull-down force is generated by a selected column of memory cells when all selected and unselected memory cells therein are turned on. The current passing through the channels of transistors 317 and 317a in the multi-bit mode is designed to be half of the current in a single bit mode.

In accordance with the given address signal Ai, the string select line SSL, the ground select line GSL and the unselected word lines WL2 to WLm transition to a high pass voltage of about 6V at T2 to turn-on the ground and string select transistors and turn-on the unselected memory cells (e.g., EEPROM) in the selected NAND string. A multi-bit read operation is preferably carried out in three cycles so that all of the four states can be detected. In particular, the selected word line voltages are stepped down from 2V to 1V and then to 0V as shown in FIGS. 2A and 3. Each of the voltages applied to the selected word line may be applied for about 8 microseconds.

Next, when a read voltage of 2V is applied to the selected word line (e.g., WL1) beginning at time T2 and the selected memory cell is storing data "00" (i.e., the selected memory cell has threshold voltage in a range from about 2.3V to 2.7V), the selected memory cell is held in a turned-off condition as an off-cell. This causes the voltage on the selected bit line BL2 to rise (because the sense node 315a is being driven slightly to the power supply level by the pull-up transistor 317a) and shut-off the normally-on depletion transistor 330a. With the increase in voltage on BL2, the voltage of node 342a also begins to rise. After depletion transistor 330a is turned off due to the voltage level on BL2 reaching the shut-off level at about time T2, most of the current supplied to BL2 through pull-up transistor 317a (while normally-on depletion transistor 330a is conducting) flows to other nodes connected to sense node 315a, including sense node 315. When this occurs, the gate electrodes of the NMOS transistors 321 and 321a are driven high and NMOS transistors 321 and 321a are turned on.

Latch control signals φR1 and φV2 are then activated in sequence after time T3 while φV1 is held at a low level. In particular, latch control signal φR1 is first set high during time T3 to pull down node 313 (Q1B) and switch latch 311 by setting node 312 high. Here, NMOS transistor 324 is turned on because the output of latch 311a (Q2B) is high at the time φR1 is pulsed high. Then, latch control signal φV2 is set high to pull down node 313a (Q2B) and switch latch 311 a by setting node 312a high. Thus, the state of "11" will be generated as IO2, IO1. In contrast, in the event the selected memory cell is storing a state other than "00" as described above, the selected bit line BL2 will not be pulled high during the interval T3 (because a highly conductive path will be provided between BL2 and CSL) and therefore Q1 and Q2 will remain low at their preset levels where (Q2,Q1)=(0,0).

In the event the selected memory cell is written with "01", then during time T3 the selected cell will not turn off until the selected word line voltage drops from 2V to 1V at the end of time T3. The voltage on node 342a then goes to a high level and then Q2B transitions to a low level (from a high level) because only latch control signal φV2 is activated during the latter portion of time interval T4. Setting Q2B to a low level turns off transistor 324 and thus the state Q1B cannot change from its initial high level state. The state of Q2B and Q1B will reflect the state "01" of the selected memory cell and (Q2,Q1)=(IO2,IO1)=(1,0).

To read data equal to "10" in the selected memory cell, the selected word line voltage transitions from 1V to 0V during T5 and only φR1 is enabled. This causes node 313 (Q1B) to transition to a low level so that the state of Q2B and Q1B will reflect the state "10" of the selected memory cell and (Q2,Q1)=(IO2,IO1)=(0,1). In reading data "11" during time interval T5, the selected memory cell is in a turned-on state for all of the word line voltages because the threshold voltage is less than about −2.7V. Since node 342a is pulled down to a low level by the on-cell (and thus sense nodes 315 and 315a go to a low level) transistors 321 and 321a are turned off so as to maintain the states of Q1B and Q2B at their originally set high levels of "11" so that (Q2,Q1)= (IO2,IO1)=(0,0), even if the latch control signals are pulsed.

Performing Multi-bit Programming and Verification Operations

Figure 4:
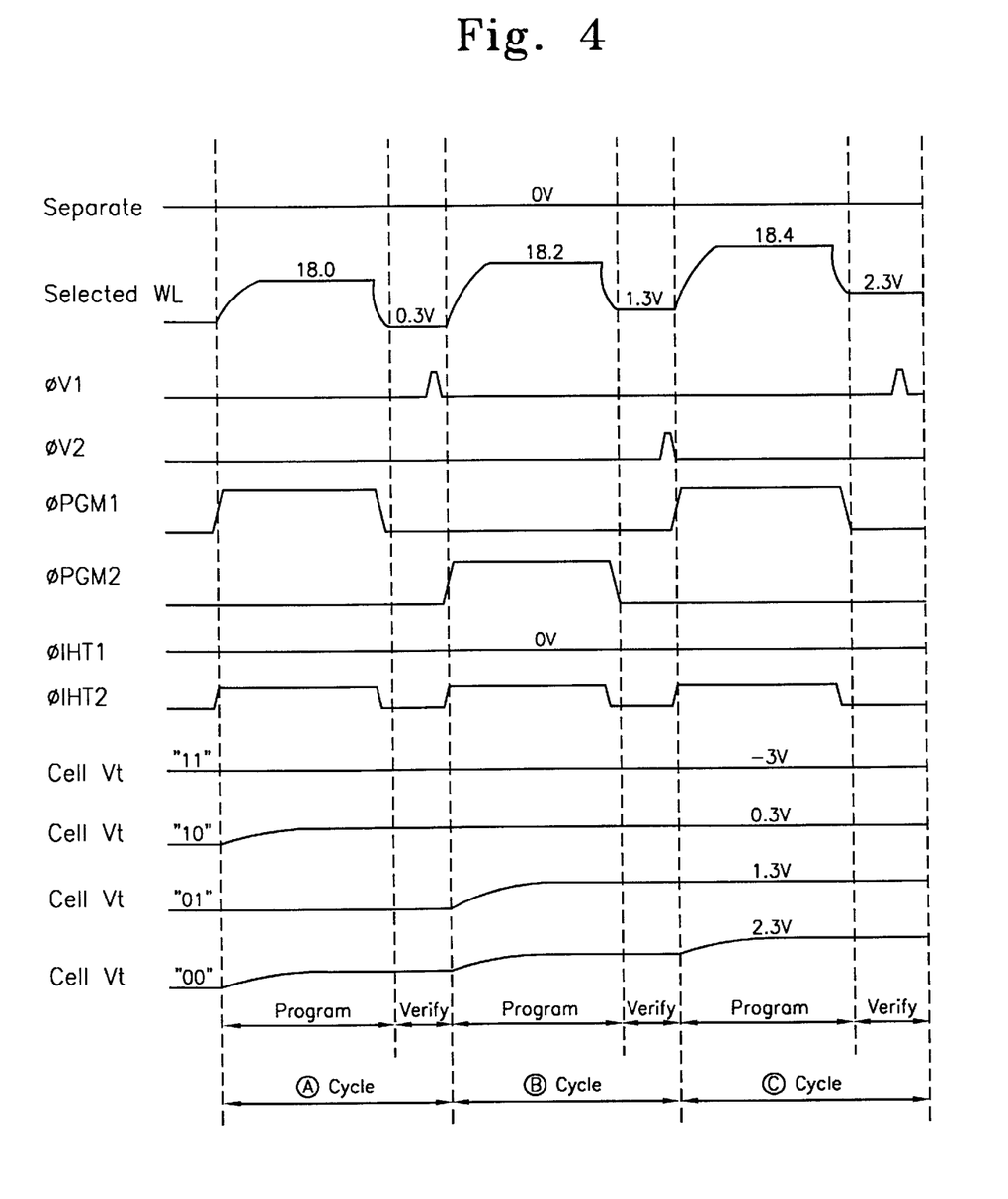
FIG. 4 is a diagram that illustrates the timing of signals used to perform multi-state programming and verifying operations according to an embodiment of the present invention.

During programming of an EEPROM cell, electrons move to the floating gate from the bulk of a selected memory cell through a tunnel oxide (called Fowler Nordheim tunneling). To program a selected memory cell, a voltage of 14V–19V is typically applied to a control gate of the selected memory cell through a selected word line while the channel region of the selected memory cell is held at ground potential. The crowding of electrons at the floating gate causes the threshold voltage of the selected memory cell to be increased to meet with a desired value. After an initial programming step, a program verification operation is performed to detect whether the selected memory cell has been programmed to a desired threshold voltage. A memory cell that has been verified as a completely programmed cell is excluded from the next programming operation by applying a respective programming inhibition voltage so that the bit line coupled to the verified cell is pulled high. Each programming operation and corresponding programming verification operation form one unit programming step for every data state. The unit programming steps (A, B or C in FIG. 4) are repeatedly performed within the predetermined number of cycles until all of the selected memory cells completely reach the desired threshold voltage (i.e., program state). However, because of the difference between threshold voltages in accordance with the program states of "00", "01", "10" and "11", the number of unit programming steps to be carried out for the four program states are different from each other. In particular, as shown in FIG. 4, programming data "00" needs three unit programming steps A, B and C whereas the operations for programming "01" and "10" are accomplished in two and one unit programming steps, respectively. Moreover, assuming that the number of recurrent cycles in each unit programming step is 16, the recycling times of the unit programming step to be conducted may be 16 (in A) for "10", 32 (in A+B) for "01" or 48 (in A+B+C) for "00". It should be understood that the number of recurrent cycles in the unit programming step is designed by considering several conditions such as window margin for programming, the stability of the programming voltage and any limitation about over-programming.

Bit lines BL1 and BL2 are selected by means of address signals AiB and Ai. When a selected bit line (e.g., BL1) is being activated for programming, the unselected bit line (e.g., BL2) is pulled up to Vcc by applying an inhibition signal (e.g., $\phi$IHT2) so that a memory cell coupled to a selected word line and the unselected bit line is not inadvertently programmed. A programming operation commences after data to be programmed is supplied to input/output lines IO1 and IO2 and then stored in latches 311 and 311a.

Now referring to FIG. 4, the programming and verifying sequences for data states "11" through "00" will be explained in detail. In FIG. 4, $\phi$SEP is set to a low level to connect sense nodes 315 and 315a to each other and thereby enable multi-bit programming. $\phi$PGM1 and $\phi$PGM2 are alternately activated during consecutive programming operations A, B and C. Latch control verification signals $\phi$V1 and $\phi$V2 are also alternately activated during consecutive verification operations. As FIG. 4 shows, when a memory cell coupled to BL1 is selected to be programmed, $\phi$IHT1 is held at a low level, while $\phi$IHT2 is activated during every virtual programming step to prevent inadvertent programming of cells in the string coupled to the unselected bit line BL2. The waveforms "Cell Vt" are provided for each of the four data states "11", "10", "01" and "00", and represent each of the cases for programming various data states.

During each unit programming step selected (e.g., A, B and C), the selected word line voltage is increased by about 0.2 Volts. Thus, if the word line voltage is initially set at 18 Volts during the program portion of cycle A, then the word line voltage during cycles B and C will be 18.2 and 18.4 Volts, respectively. And during every verification step in cycles A–C, the voltage level of a selected word line is stepped up as 0.3V, 1.3V and 2.3V (see, verification voltages VWL1, VWL2 and VWL3 in FIG. 2B). For every programming operation A, B and C, if the outputs of latches 311 and 311a (Q1 and Q2) are detected as high levels (logic "1") after a virtual programming step, then the next unit programming step commences. The high levels at Q1 and Q2 means that a selected memory cell has been correctly programmed and therefore remains off when the corresponding verification voltage is applied to the selected word line.

Programming "11" is the same as performing an erase operation so that a selected memory cell has a negative threshold voltage (such as below −2.7V as shown in FIGS. 2A or 2B). Thus, before programming, a block erase operation may be performed on a block of memory cells. In programming "10", to make the threshold voltage Vth of the selected cell be higher than 0.3V, initial levels on Q1 and Q2 are respectively set to low and high levels, respectively, by applying these levels to IO1 and IO2 and 18V is applied to a selected word line (e.g., WL1) to initiate programming. During programming and verification cycle A, $\phi$PGM1 is set to a high level while $\phi$PGM2 is set to a low level so that Q1 is connected to the selected bit line BL1 but Q2 is not connected to BL2. $\phi$IHT2 is also set high to pull up BL2 to prevent inadvertent programming. If a selected memory cell (e.g., M1) has the threshold voltage higher than 0.3V after being programmed, sense node 315 will be pulled up to a high level when the verification voltage (VWL3) of 0.3V is applied because the selected memory cell acts as an off-cell. During this verification operation, both $\phi$PGM1 and $\phi$PGM2 are held low to isolate sense nodes 315 and 315a from nodes 312 and 312a. Transistor 321 is also turned on when sense node 315 is pulled high. As shown in FIG. 4, since verification signal $\phi$V1 is pulsed high during the verify portion of cycle A, transistor 322 is turned on because Q2 is at a high level and Q1 then changes to high level (logic "1") from a low level. This transition of Q1 to a high level means the selected memory cell is completely programmed as evidenced by the fact that both Q1 and Q2 are high. Thus, the selected memory cell connected to BL1 is not further programmed.

Next, to program "01" into the selected cell, the initial states of Q1 and Q2 are set to high and low levels, respectively. During cycle A, $\phi$PGM1 is set high but no programming operation is performed because the high level of Q1 translates to a high BL1 (because AiB is high) which prevents programming. However, during cycle B, since $\phi$PGM2 is set high to connect Q2 to the selected bit line BL1 through nodes 315a and 315 (and Q1 is not connected to BL1 since PGM1 is set low), the selected memory cell (e.g., M1) is programmed by the word line voltage of 18.2V. Because of the higher programming voltage, the Vth of the selected memory cell is increased to be over 1.3V. Then, the verification voltage of 1.3V (VWL2) reads the memory cell as an off-cell and thereby Q2 changes to high level when verification signal $\phi$V2 is pulsed high. No further programming occurs after a successful verification operation when Q1 and Q2 are both high.

Programming "00" starts by setting Q1 and Q2 to low levels. During cycle A, since $\phi$PGM1 is set to a high level, the selected memory cell (e.g., M1) is programmed to have a threshold voltage of higher than 0.3V by the first word line voltage of 18V. During the verification operation at the end of cycle A, Q1 is not set to a high level even though the memory cell acts as an off-cell for the verification voltage of 0.3V. This is because Q2 remains at a low level to prevent transistor 322 from being turned on. Because transistor 322 is turned off, Q1B cannot be pulled down to a low level. Thus, during cycle B, the selected memory cell is programmed further by the second word line voltage of 18.2V to have an increased threshold voltage of higher than 1.3V. Here, BL1 is held at a low level to allow for programming because Q2 is low and $\phi$PGM2 is high. Then, the verification voltage of 1.3V reads the memory cell as an off-cell and Q2 goes to a high level when (φV2 is pulsed. Then, during cycle C, since φPGM1 becomes activated again while φPGM2 is disabled, Q1 which has been still held at a low level contributes to further programming with the third word line voltage of 18.4V. The selected memory cell is thereby positioned at a threshold voltage of higher than 2.3V. When the verification voltage of 2.3V reads the memory cell as an off-cell, the programming process for "00" is terminated because Q1 is set high when φV1 is pulsed and NMOS transistor 322 is on because Q2 is high.

Performing Multi-bit Erase and Erase-Verification Operations

Figure 5:
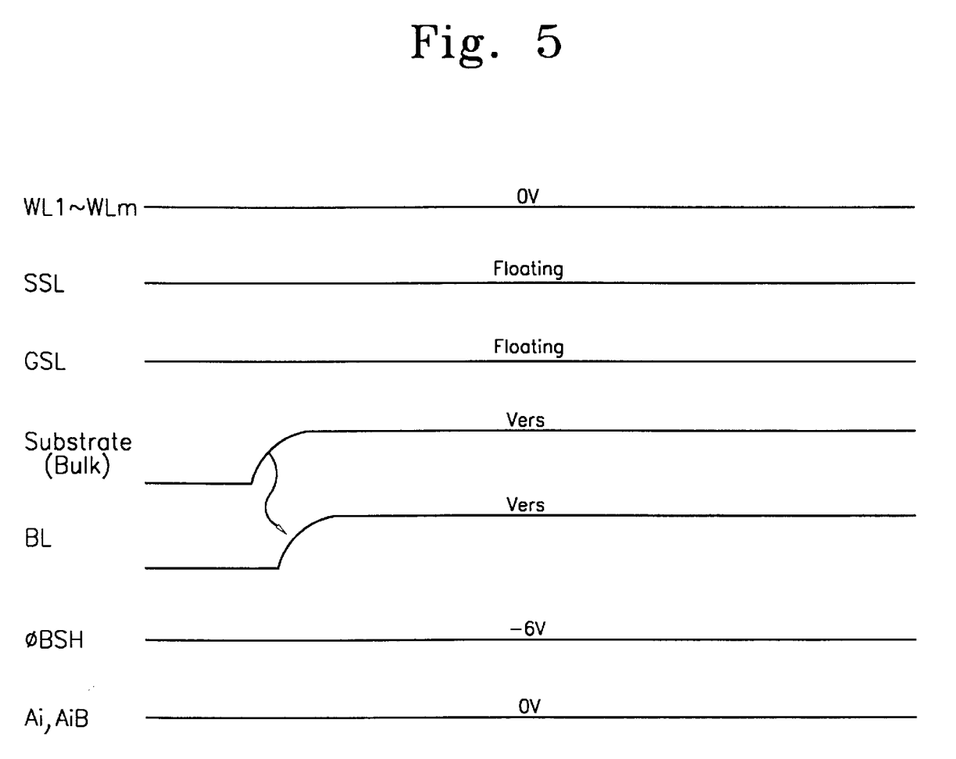
FIG. 5 is a diagram that illustrates the timing of signals used to perform erase operations according to an aspect of the present invention.

Erase operations are typically carried out on blocks of memory. For an example, in FIG. 1, assuming that memory cell array 100 corresponds to one block, all the memory cells in the block are simultaneously put into an erased mode. Referring to FIG. 5, all of word lines WL1 to WLm are held at a low level of 0V, string selection line SSL and ground selection line GSL are situated in floating states, and an erasure voltage Vers of high level about from 21V to 24V is applied to the substrate or bulk. The voltage levels on the bit lines follow the level of Vers due to the forward biased junction between the bulk and the drain regions of the memory cells which are coupled to the bit lines. Bit line shielding signal φBSH is charge to −6V to make transistors 330 and 330a be turned off, and address signals Ai and AiB retain low levels.

Figure 6:
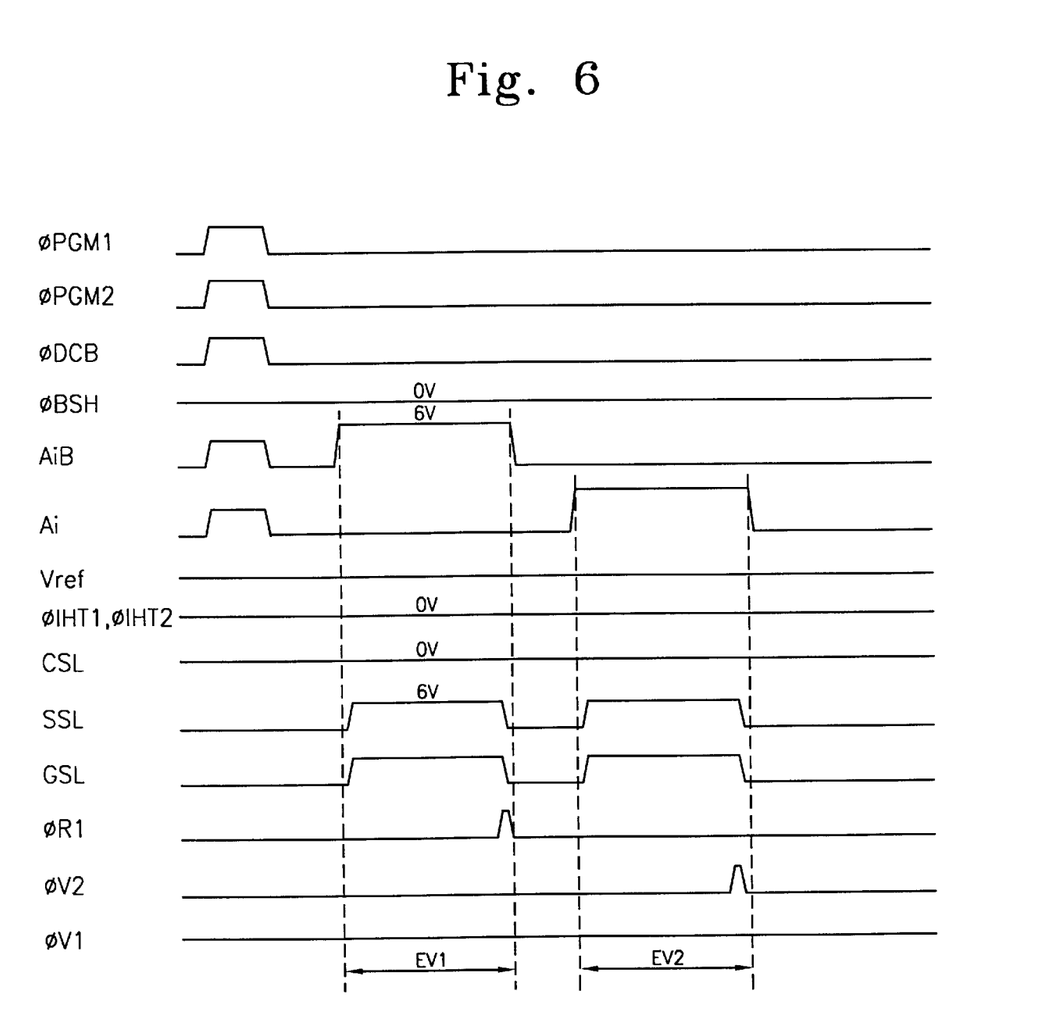
FIG. 6 is a diagram that illustrates the timing of signals used to verify the erase operations performed in accordance with the operations of FIG. 5.

After the block erase operation, an erase verifying operation starts as the programming verification does. And this verification is carried out in two steps of EV1 and EV2, as shown in FIG. 6, for odd bit lines (BL1, . . . ) and even bit lines (BL2, . . . ), respectively. As an initial step, signals φPGM1, φPGM2, φDCB, AiB and Ai are all set to high levels and transistors 330 and 330a are turned on to make Q1 and Q2 be pulled down to low levels. φIHT1 and φIHT2 are also held at low levels. For erasing the odd bit lines during EVI, AiB goes to 6V and SSL and GSL is also charged up to 6V. Word lines of the selected memory block are coupled to 0V. If all the memory cells involved in the odd bit lines (BL1, . . . ) have been completely erased through the preceding erasure cycle, during erase verification they are detected on the bit lines as on-cells and therefore nodes 342 become low levels (referred to as "pass status"). To the contrary, if there is at least one memory cell which has not been erased thereby (i.e., off-cell), node 342 is pulled up to a high level and then Q1 changes from a low level to a high level because Q2B is at a high level and φR1 is pulsed to a high level to turn on transistors 324 and 325. Such result means that an erasure operation for the odd bit lines must be repeatedly performed until the pass status appears (i.e., Q1=0). And next, in verifying the even bit lines (BL2, . . . ) during EV2 for which Ai becomes 6V instead of AiB, the under-erasure condition is read from the logic state of Q2. If an under-erase condition is present, Q2 will switch from a low level to a high level when node 315a and φV2 go high and cause Q2B to be pulled down to a low level.

Performing Single Bit Operations

Figure 7:
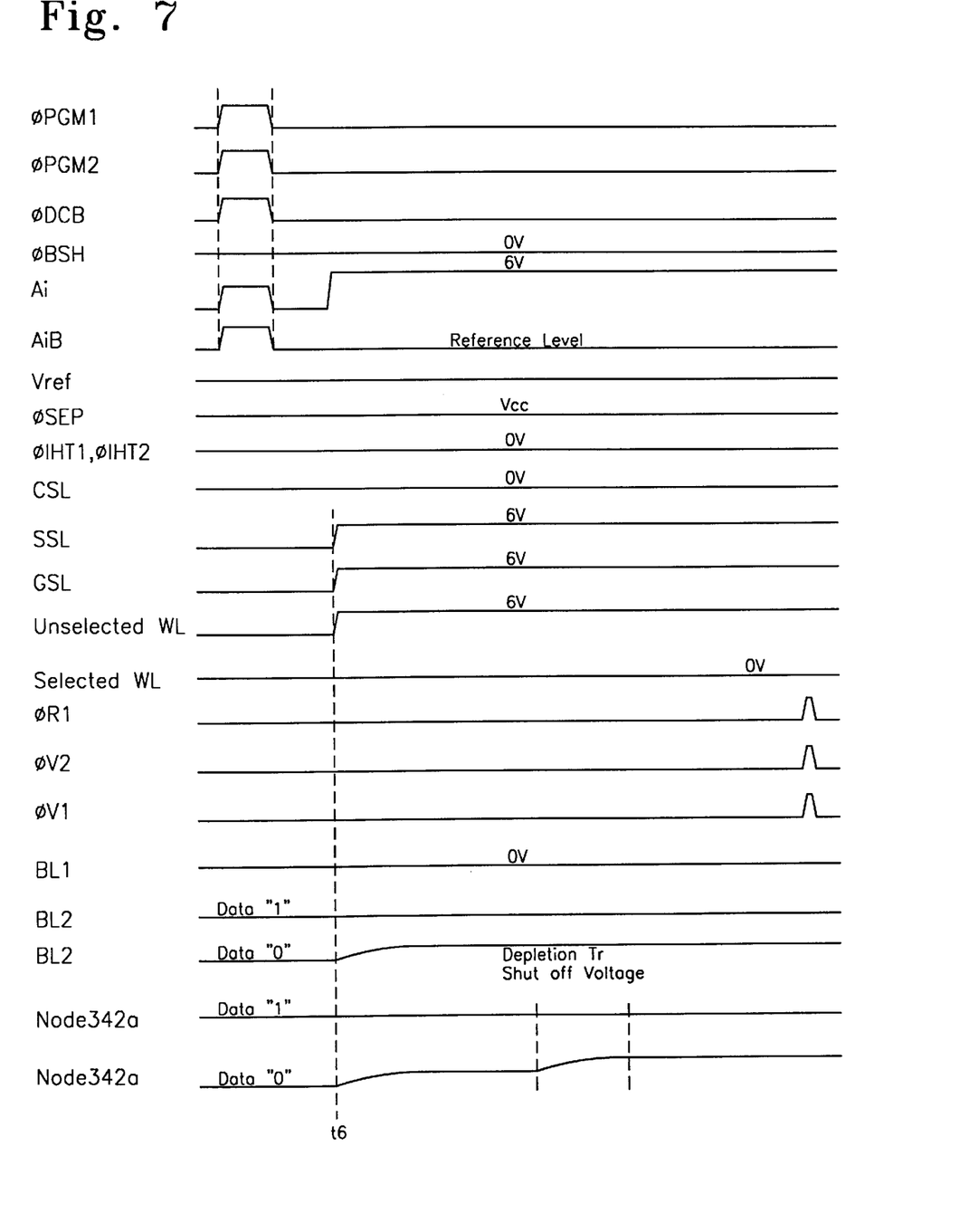
FIG. 7 is a diagram that illustrates the timing of signals used to perform single-bit read operations according to an embodiment of the present invention.
Figure 8:
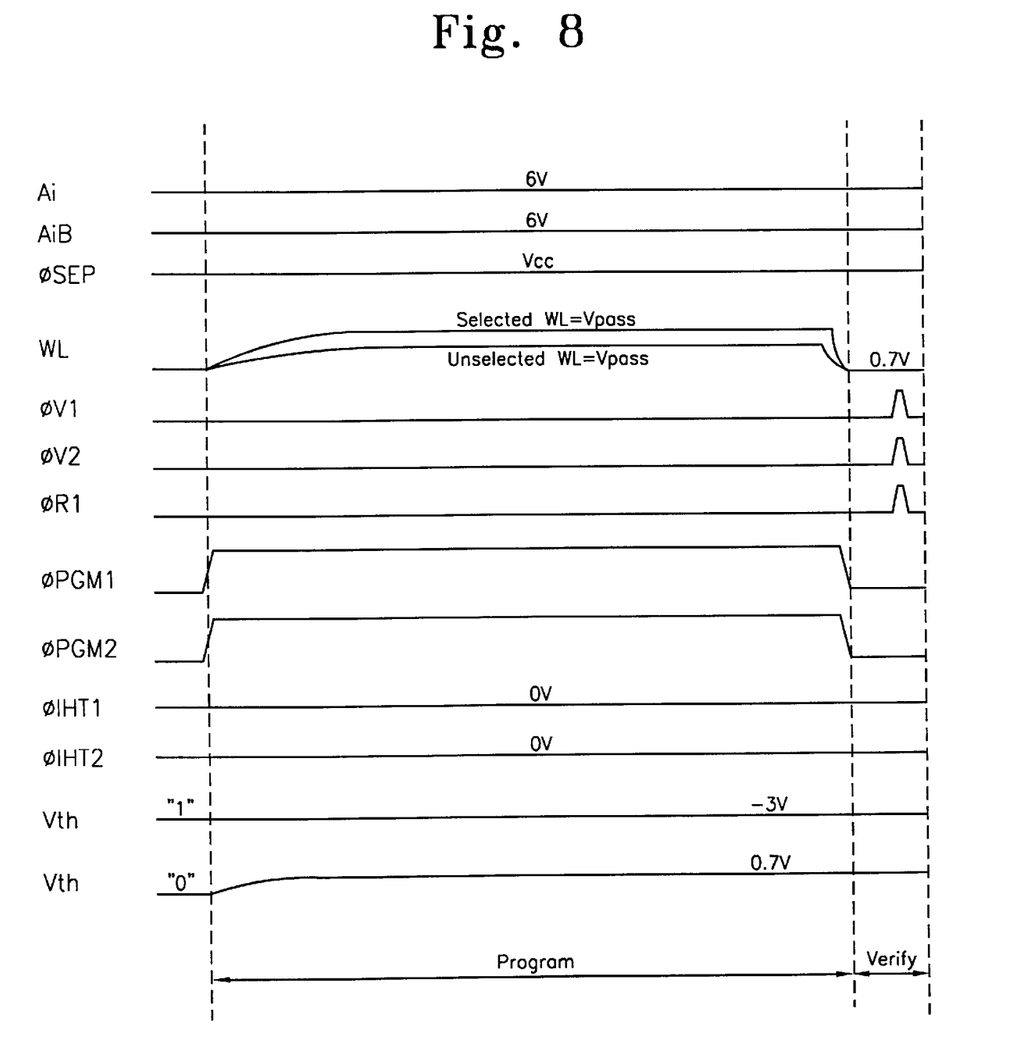
FIG. 8 is a diagram that illustrates the timing of signals used to perform single-bit program operations according to an embodiment of the present invention.
Figure 9:
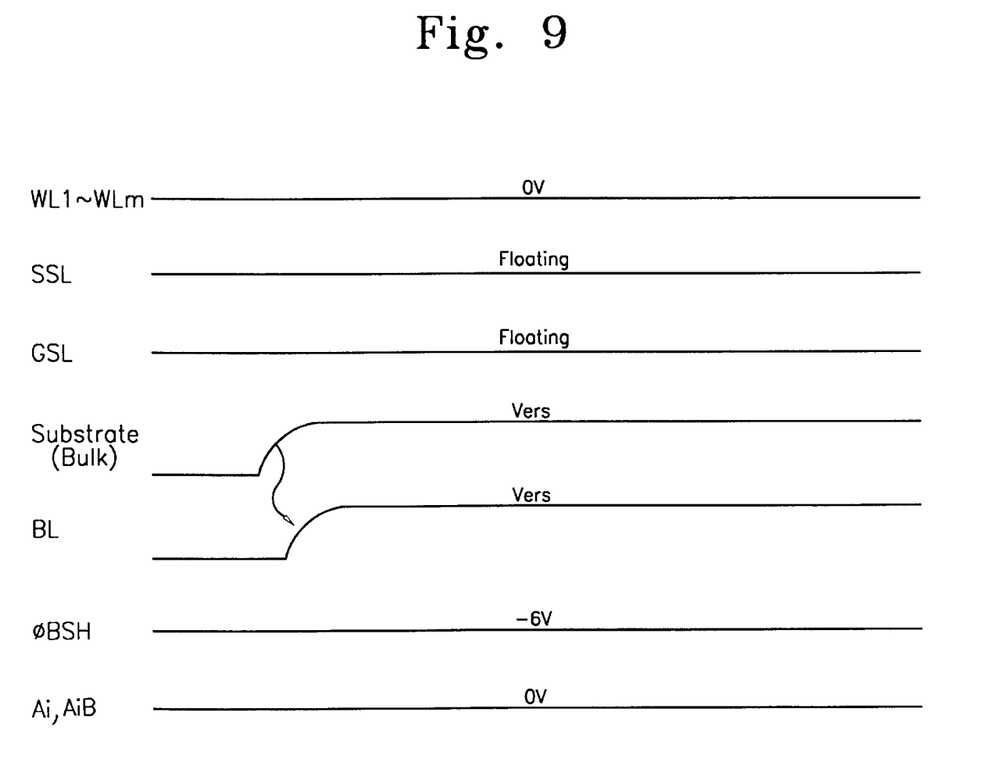
FIG. 9 is a diagram that illustrates the timing of signals used to perform erase operations according to an aspect of the present invention.

In a single bit mode, the separation signal φSEP goes to high level to disconnect sense nodes 315 and 315a so that the bit lines can be independently controlled. During the single bit mode, the latch control signals φR1, φV1 track each other and go high at the same time so that node 326 can be pulled low irrespective of the value of Q2 and Q2B. Latch control signal φV2 can also track φR1 and φV1 so that adjacent bit lines can be programmed and read simultaneously. Referring to FIG. 7 in which BL2 is regarded as a selected bit line, reading a single bit is accomplished by applying 6V to SSL, GSL and unselected word lines at time T6. If a selected memory cell is an off-cell, BL2 and node 342a go to high levels to turn transistor 321a on. Q2B is then pulled down to a low level and Q2 is set to a high level when φV2 is pulsed high. If the selected memory cell is an on-cell, Q2 becomes a low level that is the initial state. Referring now to FIG. 8, programming of a single bit can be performed in a conventional manner by applying a Vpass voltage to unselected word lines while applying a program voltage Vpgm to the selected word line. In programming verification, a word line voltage of 0.7V can be used to determine whether a programmed memory cell is an on-cell or an off-cell. Programming may be performed again if the memory cell has a threshold voltage below 0.7V. FIG. 9 illustrates the timing of signals used to perform an erase operation for the single bit mode which is the same as the multiple bit mode. Thus, by setting φSEP high, the memory device of the present invention can be operated in a single bit mode of operation using conventional programming, verification, reading and erasure operations.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. In an integrated circuit memory device containing an array of memory cells, first and second input/output lines electrically coupled to respective first and second sense amplifiers, and first and second bit lines electrically coupled to respective first and second pluralities of memory cells in the array, a method of reading data, comprising the steps of:

electrically coupling the second bit line to a selected memory cell in the second plurality of memory cells and to first and second sense nodes in the first and second sense amplifiers;

applying a first word line potential to the selected memory cell and then driving the first and second input/output lines with first data if a state of the selected memory cell is a first state;

applying a second word line potential to the selected memory cell and then driving the first and second input/output lines with second data if the state of the selected memory cell is a second state unequal to the first state; and applying a third word line potential to the selected memory cell and then driving the first and second input/output lines with third data if the state of the selected memory cell is a third state unequal to the first or second states.

2. The method of claim 1, wherein said electrically coupling step comprises electrically connecting the first and second sense nodes together using a pass transistor.

3. The method of claim 1, wherein said electrically coupling step is preceded by the steps of electrically connecting the first and second bit lines to the first and second sense nodes, respectively; electrically connecting the first and second sense nodes together; and driving the first and second sense nodes to a first reference potential to reset the first and second sense amplifiers.

4. The method of claim 2, further comprising the step of electrically disconnecting the first bit line from the first sense node during said steps of applying first, second and third word line potentials.

5. The method of claim 2, wherein the first, second and third word line potentials are unequal.

6. The method of claim 1, wherein the first and second sense amplifiers contain first and second latches, respectively; and wherein said step of applying a first word line potential is preceded by the step of resetting the first and second latches.

7. The method of claim 6, wherein said step of applying a first word line potential comprises changing a state of both the first and second latches if the state of the selected memory cell is the first state.

8. The method of claim 7, wherein a magnitude of the first word line potential is greater than a magnitude of the second word line potential; and wherein said step of applying a second word line potential comprises changing a state of either the first latch or second latch if the state of the selected memory cell is the second state.

9. The method of claim 8, wherein said step of applying a first word line potential comprises simultaneously driving the sense nodes of both the first and second sense amplifiers from a first reference potential to a second reference potential if the state of the selected memory cell is the first state.

10. An integrated circuit memory device, comprising:
first and second pluralities of nonvolatile memory cells electrically coupled to respective first and second bit lines;
first and second sense amplifiers having respective latches therein;
first and second input/output lines electrically coupled to the latches of the first and second sense amplifiers, respectively;
means for electrically coupling a sense node of said first sense amplifier to the first bit line, in response to a first address signal;
means for electrically coupling a sense node of said second sense amplifier to the second bit line, in response to a second address signal; and
means for electrically connecting the sense nodes of the first and second sense amplifiers together in response to a separation control signal.

11. The memory device of claim 10, further comprising first and second latch control circuits electrically coupled to the latches of the first and second sense amplifiers, respectively.

12. The memory device of claim 11, wherein the latches of the first and second sense amplifiers each have normal and complementary outputs; wherein the first and second latch control circuits are electrically coupled to the complementary outputs of the latches of the first and second sense amplifiers, respectively; and wherein the first latch control circuit is also electrically connected to the normal and complementary outputs of the latch of the second sense amplifier.

13. The memory device of claim 12, wherein the second latch control circuit comprises first and second MOS transistors electrically coupled in series between the complementary output of the latch of the second sense amplifier and a reference potential; and wherein a gate of the first MOS transistor is electrically connected to a sense node of the second sense amplifier.

14. The memory device of claim 13, wherein a drain of the first MOS transistor is electrically connected to the complementary output of the latch of the second sense amplifier and the first latch control circuit.

15. An integrated circuit memory device, comprising:
first and second pluralities of nonvolatile memory cells electrically coupled to respective first and second bit lines;
first and second sense amplifiers having respective latches therein, electrically coupled to first and second input/output lines;
means for electrically coupling a sense node of said first sense amplifier to the first bit line, in response to a first address signal;
means for electrically coupling a sense node of said second sense amplifier to the second bit line, in response to a second address signal; and
means, electrically coupled to the latches and sense nodes of said first and second sense amplifiers, for selectively configuring the memory cells as multi-bit memory cells by electrically connecting the sense nodes of the first and second sense amplifiers together in response to a separation control signal.

16. The memory device of claim 15, wherein said means for selectively configuring the memory cells as multi-bit memory cells includes a pass transistor electrically connected between the sense nodes of the first and second sense amplifiers.

17. The memory device of claim 15, wherein said means for selectively configuring the memory cells as multi-bit memory cells includes first and second latch control circuits electrically coupled to the latches of the first and second sense amplifiers, respectively.

18. The memory device of claim 17, wherein said first and second latch control circuits are electrically connected to the sense nodes of the first and second sense amplifiers.

19. The memory device of claim 18, wherein the latches of the first and second sense amplifiers each have normal and complementary outputs; and wherein said first latch control circuit is electrically connected to the normal and complementary outputs of the latch of the second sense amplifier.

20. An integrated circuit memory device, comprising
a plurality of nonvolatile memory cells; and
means, coupled to the memory cells, for selectively configuring the memory cells as multi-bit memory cells during a multi-bit mode of operation and as single-bit memory cells during a single-bit mode of operation, and
wherein said means for selectively configuring the memory cells comprises first and second sense amplifiers that can be electrically coupled to first and second strings of memory cells in the plurality thereof, and means, responsive to a separation control signal, for electrically connecting sense nodes of the first and second sense amplifiers together during the multi-bit mode of operation.

21. The memory device of claim 20, wherein said first and second sense amplifiers have first and second latches therein, respectively; wherein the first and second latches each have normal and complementary outputs; and wherein the normal outputs of the first and second latches are electrically coupled to first and second input/output lines, respectively.

22. The memory device of claim 21, wherein said means for selectively configuring the memory cells comprises first and second latch control circuits electrically connected to the complementary outputs of the first and second latches, respectively.

23. The memory device of claim 22, wherein said first latch control circuit is electrically connected to the normal and complementary outputs of the second latch.

24. The memory device of claim 23, wherein the first and second latch control circuits are electrically connected to the sense nodes of the first and second sense amplifiers, respectively.

25. An integrated circuit memory device, comprising:

first and second strings of nonvolatile memory cells;

first and second bit lines electrically coupled to said first and second strings of nonvolatile memory cells; and a page buffer electrically connected to said first and second bit lines, said page buffer including first and second sense amplifiers having first and second sense nodes therein, respectively, and means, responsive to a separation control signal, for electrically connecting the first and second sense nodes together during a multi-bit mode of operation.

26. The memory device of claim 25, wherein said means for electrically connecting the first and second sense nodes together comprises a pass transistor electrically connected in series between the first and second sense nodes, so that the memory device can be operated in a single-bit mode of operation when the separation control signal is in a first logic state and the multi-bit mode of operation when the separation control signal is in a second logic state opposite the first logic state.

27. The memory device of claim 26, wherein the first and second sense amplifiers have first and second latches therein, respectively; wherein the first and second latches each have normal and complementary outputs; and wherein the normal outputs of the first and second latches are electrically coupled to first and second input/output lines, respectively.

28. The memory device of claim 27, wherein said page buffer further comprises first and second latch control circuits electrically connected to the complementary outputs of the first and second latches, respectively.

29. The memory device of claim 28, wherein the first latch control circuit is electrically connected to the normal and complementary outputs of the second latch.

30. The memory device of claim 29, wherein the first and second latch control circuits are electrically connected to the first and second sense nodes, respectively.

31. The memory device of claim 30, wherein said page buffer further comprises means, responsive to complementary address signals, for electrically connecting the first and second sense nodes to said first and second bit lines, respectively, and electrically disconnecting the first and second from each other during the single-bit mode of operation.

32. The memory device of claim 26, wherein said page buffer further comprises means, responsive to complementary address signals, for electrically connecting the first and second sense nodes to said first and second bit lines, respectively, and electrically disconnecting the first and second from each other during the single-bit mode of operation.

33. The memory device of claim 32, wherein said first and second strings of nonvolatile memory cells comprise first and second NAND strings of EEPROM cells.

* * * * *

UNITED STATES PATENT AND TRADEMARK OFFICE
CERTIFICATE OF CORRECTION

PATENT NO. : 5,862,074
DATED : January 19, 1999
INVENTOR(S) : Jong-Wook Park

It is certified that error appears in the above-identified patent and that said Letters Patent is hereby corrected as shown below:

On the title page, Item [30]Foreign Application Priority Data,
     Oct. 4,1996  [KR] Rep. of Korea............96-43936

Signed and Sealed this

Third Day of August, 1999

Attest:

Q. TODD DICKINSON

Attesting Officer

Acting Commissioner of Patents and Trademarks